(12) United States Patent
Yang et al.

(10) Patent No.: US 8,087,964 B2
(45) Date of Patent: Jan. 3, 2012

(54) METHOD OF FABRICATING ORGANIC LIGHT EMITTING DIODE (OLED)

(75) Inventors: Nam-Choul Yang, Suwon-si (KR); Sam-Il Kho, Suwon-si (KR); Byeong-Wook Yoo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 647 days.

(21) Appl. No.: 11/598,790

(22) Filed: Nov. 14, 2006

(65) Prior Publication Data
US 2007/0123135 A1 May 31, 2007

(30) Foreign Application Priority Data
Nov. 29, 2005 (KR) .................. 10-2005-0115138

(51) Int. Cl.
*H01J 9/00* (2006.01)
*H01J 9/24* (2006.01)

(52) U.S. Cl. ......................................... 445/24
(58) Field of Classification Search ............. 445/24; 313/498–512
See application file for complete search history.

(56) References Cited

U.S. PATENT DOCUMENTS

| | | | |
|---|---|---|---|
| 6,515,418 B1 | 2/2003 | Geens et al. | |
| 6,522,066 B2 | 2/2003 | Sheu et al. | |
| 2003/0107314 A1 | 6/2003 | Urabe et al. | |
| 2004/0066480 A1* | 4/2004 | Yoshida et al. | 349/123 |
| 2004/0147200 A1* | 7/2004 | Urabe et al. | 445/24 |
| 2004/0195963 A1 | 10/2004 | Choi et al. | |
| 2005/0062407 A1 | 3/2005 | Suh | |
| 2005/0093434 A1 | 5/2005 | Suh et al. | |
| 2005/0093435 A1 | 5/2005 | Suh et al. | |

FOREIGN PATENT DOCUMENTS

| | | |
|---|---|---|
| CN | 1426269 | 6/2003 |
| JP | 2002-15861 | 1/2002 |
| JP | 2003-234186 | 8/2003 |

(Continued)

OTHER PUBLICATIONS

Korean Office action Notice of Allowability corresponding to Korean Patent Application No. 10-20050115138, mailed on May 11, 2007.

(Continued)

*Primary Examiner* — Toan Ton
*Assistant Examiner* — Zachary Snyder
(74) *Attorney, Agent, or Firm* — Robert E. Bushnell, Esq.

(57) ABSTRACT

A method of fabricating an Organic Light Emitting Diode (OLED) includes: forming red, green, blue and white pixel regions on a substrate; forming first electrodes in the respective pixel regions on the substrate, the first electrodes being spaced apart from one another; forming a pixel defining layer having an opening partially exposing surfaces of the first pixel electrodes on the substrate; forming organic layers including at least an organic EMission Layer (EML) in the opening of the pixel defining layer; forming a second electrode on the organic layers; forming a passivation layer on the second electrode; and forming red, green and blue color filter layers on the passivation layer using a laser induced thermal imaging method to correspond to the organic layers of the red, green and blue pixel regions, the red, green and blue color filter layers being sequentially formed and ends of a first-formed color filter layer overlapping second and third formed color filter layers.

14 Claims, 6 Drawing Sheets

FOREIGN PATENT DOCUMENTS

| | | |
|---|---|---|
| JP | 2004-227851 | 8/2004 |
| JP | 2004-311440 | 11/2004 |
| JP | 2005-100939 | 4/2005 |
| KR | 10-2001-0083094 | 8/2001 |
| KR | 10-2007-0056468 | 6/2007 |

OTHER PUBLICATIONS

Office Action from the Chinese Patent Office issued in Applicant's corresponding Chinese Patent Application No. 2006101628456 dated Jun. 27, 2008.

Merriam-Webster Unabridged, (2005) definition for "sequential".

Request for Entry of the Accompanying Office Action for the Japanese Office Action attached herewith.

Office action from Japanese Patent Office issued in Applicant's corresponding Japanese Patent Application No. 2006-321891 dated Oct. 27, 2009.

Extended European Search Report dated Nov. 25, 2010, corresponding to European Patent Application No. 06256117.0.

* cited by examiner

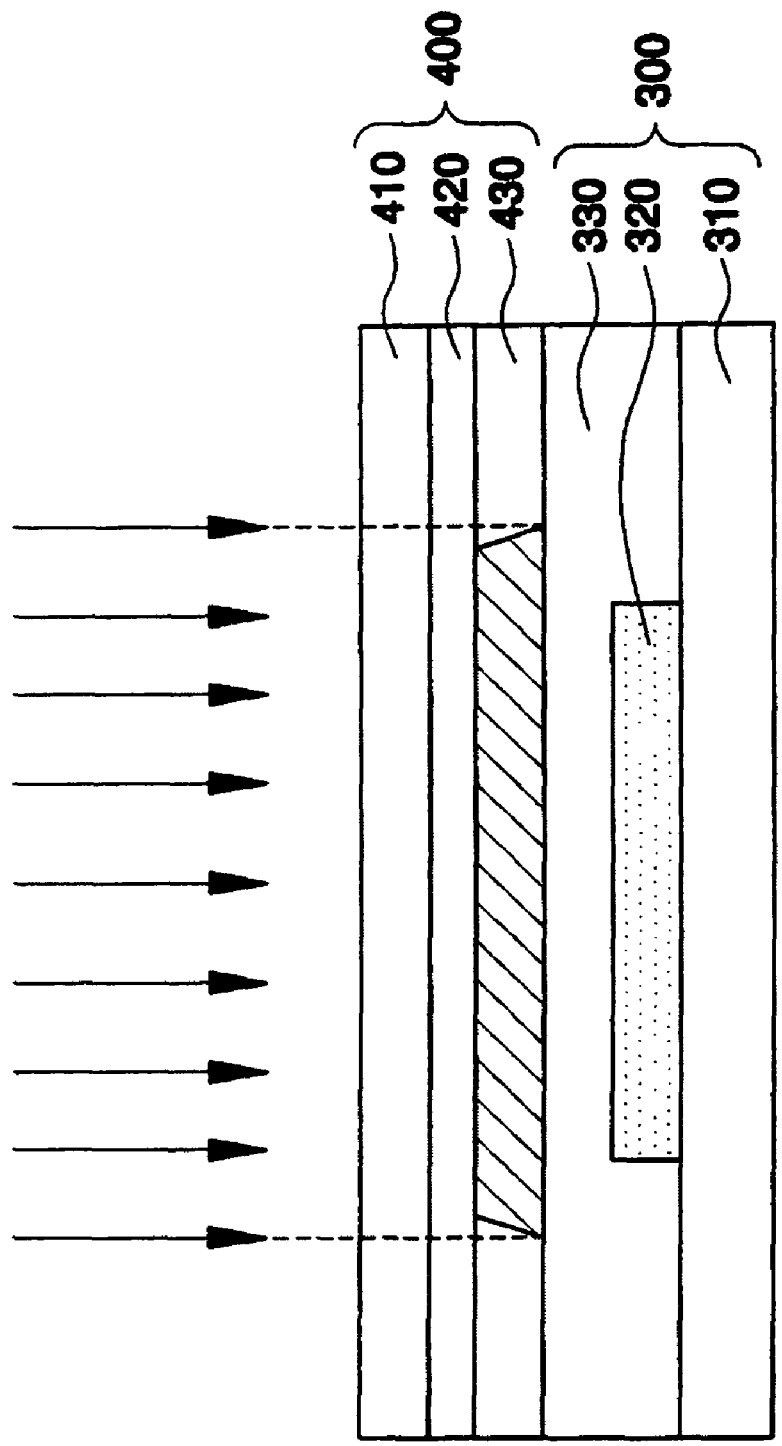

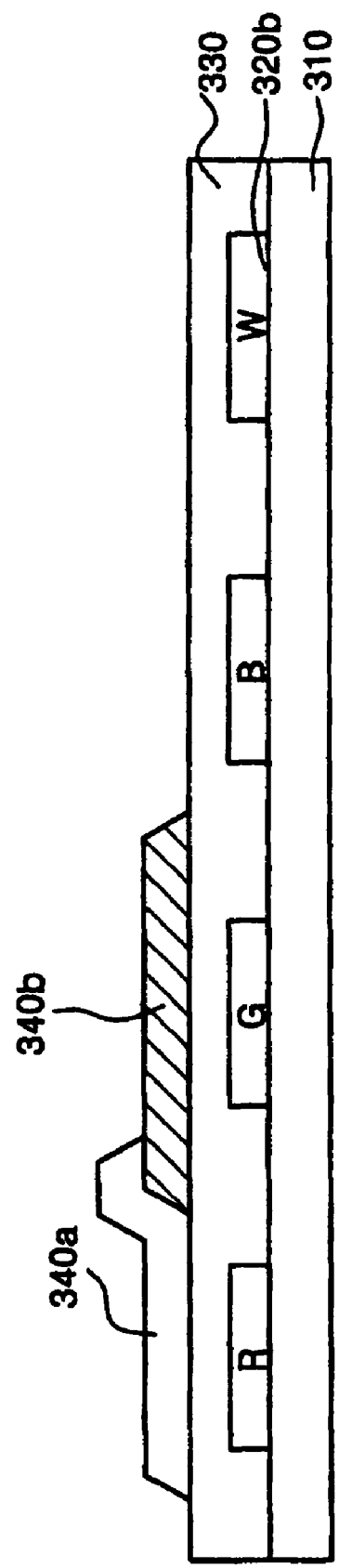

METHOD OF FABRICATING ORGANIC LIGHT EMITTING DIODE (OLED)

CLAIM OF PRIORITY

This application makes reference to, incorporates the same herein, and claims all benefits accruing under 35 U.S.C.§119 from an application for METHOD OF FABRICATING ORGANIC LIGHT EMITTING DIODE earlier filed in the Korean Intellectual Property Office on the 29$^{th}$ of Nov. 2005 and there duly assigned Serial No. 2005-115138.

BACKGROUND OF THE INVENTION

1. Field of the Invention

The present invention relates to a method of fabricating an Organic Light Emitting Diode (OLED) which has a simple fabrication process, and provides high contrast and resolution.

2. Description of the Related Art

In general, Organic Light Emitting Diodes (OLEDs) are composed of a substrate, an anode disposed on the substrate, an EMission Layer (EML) disposed on the anode, and a cathode disposed on the EML. In such OLEDs, when a voltage is supplied between the anode and the cathode, holes and electrons are injected into the EML. The injected holes and electrons are recombined in the EML to create excitons, which transition from an excited state to a ground state and emit light.

To implement full-color OLEDs, the OLEDs have EMLs respectively corresponding to red, green and blue. In this case, however, the EMLs corresponding to red, green and blue have different life spans from one another, so that it is difficult to keep a constant white balance during long-time operation of the OLED.

For this reason, it is necessary to form an EML emitting light of a single color and then form a color filter layer for selecting light corresponding to a predetermined color from the light emitted from the EML or a color conversion layer for converting the light emitted from the EML into light having a predetermined color. For example, an active matrix OLED using an EML emitting white light and a color filter layer formed by photolithography is discussed in U.S. Pat. No. 6,515,418. Also, an active matrix OLED using an EML emitting blue light and a color conversion layer formed by photolithography is discussed in U.S. Pat. No. 6,522,066. However, forming the color filter layer or color conversion layer using a photolithography process requires a repetitive process in which each color filter layer or a color conversion layer is formed on the entire surface of a substrate and then patterned by exposure and development processes. A thermal treatment process is required for removing volatile solvents, etc. included in the layer formed by photolithography. As such, the formation of the color filter layer or color conversion layer by using photolithography has disadvantages of numerous processing steps and long fabrication time.

To solve these problems, an OLED including a color filter layer or a color conversion layer formed by vacuum deposition is discussed in Korean Patent Application No. 2001-0000943. However, the color filter layer or the color conversion layer is formed by independently depositing each layer corresponding to red, green and blue using a metal mask. Thus, it is difficult to obtain high resolution due to difficulty in alignment of the metal mask with a substrate. A large investment in equipment is required because each layer corresponding to red, green and blue is deposited in a separate independent chamber.

SUMMARY OF THE INVENTION

The present invention provides a method of fabricating an Organic Light Emitting Diode (OLED) which has a simple process, and provides high contrast and resolution.

In an exemplary embodiment of the present invention, a method of fabricating an Organic Light Emitting Diode (OLED) includes: forming red, green, blue and white pixel regions on a substrate; forming first electrodes in respective pixel regions on the substrate, the first electrodes being spaced apart from one another; forming a pixel defining layer having an opening partially exposing surfaces of the first pixel electrodes on the substrate; forming organic layers including at least an organic EMission Layer (EML) in the opening of the pixel defining layer; forming a second electrode on the organic layers; forming a passivation layer on the second electrode; and forming red, green and blue color filter layers on the passivation layer using a laser induced thermal imaging method to correspond to the organic layers of the red, green and blue pixel regions, the red, green and blue color filter layers being sequentially formed and ends of a first-formed color filter layer overlapping second and third formed color filter layers.

The first-formed color filter layer is preferably formed to extend to a corresponding organic layer and to a non-emission region arranged between adjacent pixel regions.

A region in which the color filter layers overlap each other preferably includes a non-emission region arranged between adjacent pixel regions. A region in which the color filter layers overlap each other preferably includes 50 to 90% of a non-emission region arranged between adjacent pixel regions.

The organic EML preferably includes red, green, blue and white EMLs. The organic EML alternatively preferably includes a white EML.

The red, green and blue pixel regions are preferably arranged in a stripe pattern.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein:

FIGS. 2A and 2B are respectively a perspective view and a cross-sectional view of a method of fabricating a color filter layer using a laser induced thermal imaging method according to an exemplary embodiment of the present invention; and FIGS. 3A to 3C are cross-sectional views of a method of fabricating a color filter layer according to an exemplary embodiment of the present invention.

DETAILED DESCRIPTION OF THE INVENTION

The foregoing and other objects, features and advantages of the present invention will become more apparent from the following detailed description of exemplary embodiments of the present invention and the accompanying drawings.

Figure 1:
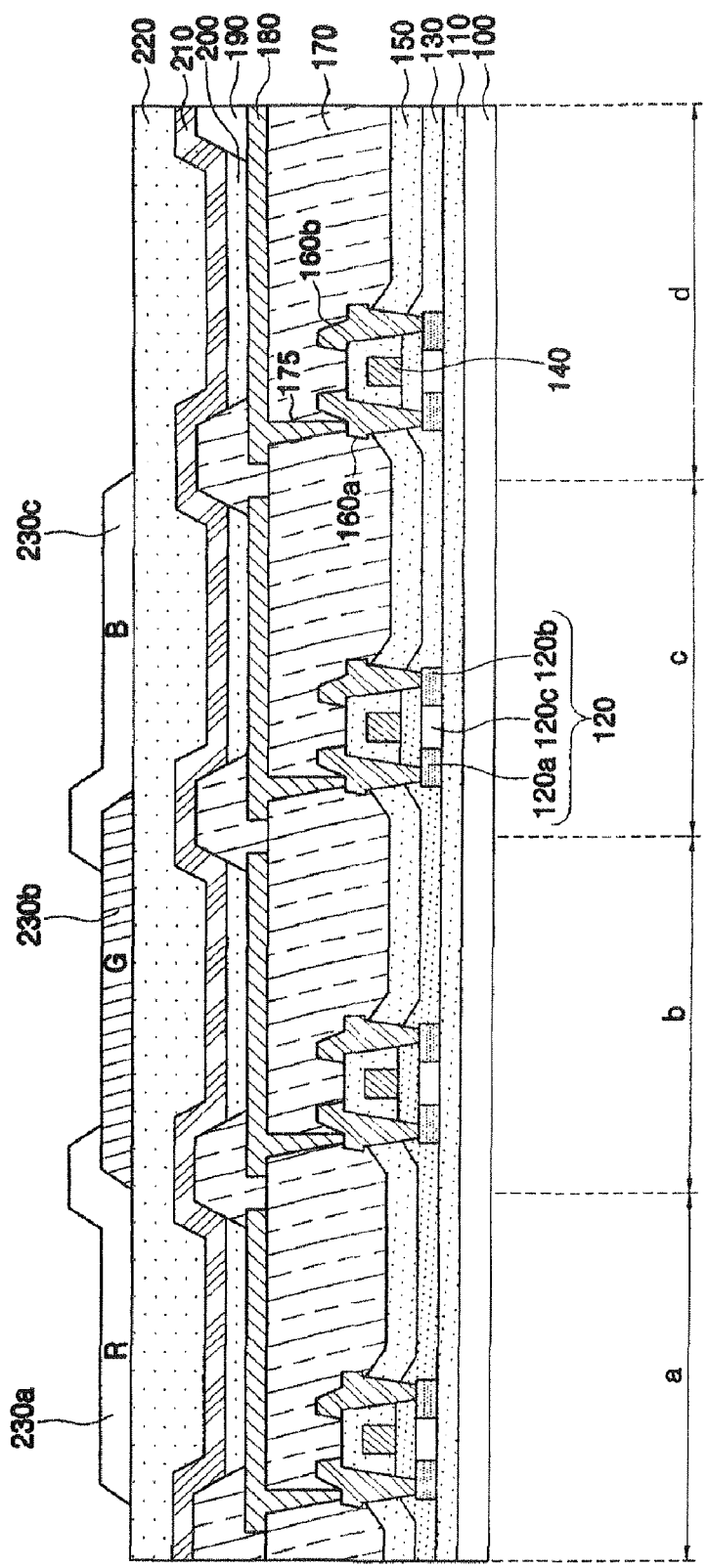
FIG. 1 is a cross-sectional view of an Organic Light Emitting Diode (OLED) according to an exemplary embodiment of the present invention.

FIG. 1 is a cross-sectional view of an Organic Light Emitting Diode (OLED) according to an exemplary embodiment of the invention.

Referring to FIG. 1, a substrate having red (a), green (b), blue (c) and white (d) pixel regions are provided. A buffer layer 110 is formed on the entire surface of the substrate 100. The buffer layer 110 functions to protect a thin film transistor to be formed in a subsequent process from impurities leaked from the substrate 100.

Semiconductor layers 120, each having source and drain regions 120a and 120b and a channel region 120c in the pixel regions a, b, c and d, are formed on the buffer layer 110.

A gate insulating layer 130 is formed on the semiconductor layers 120, and gates 140 are formed to correspond to the respective channel regions 120c on the gate insulating layer 130.

An interlayer insulating layer 150 is formed to cover the gates 140, and source and drain electrodes 160b and 160a electrically connected to the respective source and drain regions 120a and 120b are then formed on the interlayer insulating layer 150.

The semiconductor layers 120, the source electrodes 160b, the drain electrodes 160a and the gates 140 constitute thin film transistors disposed in the pixel regions a, b and c.

A planarization layer 170 is formed to cover the thin film transistors, and via holes 175, exposing the respective drain electrodes 160b, are formed in the planarization layer 170.

First electrodes 180 spaced apart from each other are formed in the respective pixel regions of the substrate having the via holes 175. Thus, the first electrodes 180 are electrically connected to the drain electrodes 160b, i.e., the thin film transistors, through the via holes 175. In the embodiment, the first electrodes 180 are reflection electrodes for reflecting light. The first electrode 180, i.e. the reflection electrode can be either an anode or a cathode.

A pixel defining layer 190 having an opening partially exposing the surface of the first electrode 180 is formed on the substrate having the first electrodes 180. The pixel defining layer 190 can be an acrylic organic layer.

Organic layers 200 having at least an organic EML are formed on the entire surface of the substrate including the exposed first electrodes 180. The organic EMLs can be all white EMLs. Alternatively, the organic EMLs can be red, green, blue and white EMLs, corresponding to the red, green, blue and white pixel regions a, b, c and d of the substrate. The organic layer 200 can further include an electric charge transport layer and/or an electric charge injection layer.

A second electrode 210 is formed on the organic layer 200. In the embodiment, the second electrode 210 is a transparent electrode, and light emitted from the organic EML is emitted through the second electrode 210. The second electrode 210 is a cathode when the first electrodes 180 are anodes, and an anode when the first electrodes 180 are cathodes.

A passivation layer 220 can be formed on the second electrode 210. The passivation layer 220 has to be transparent, and can be an inorganic layer, an organic layer or a composite layer of organic and inorganic layers. The inorganic layer can be selected from the group consisting of ITO, IZO, $SiO_2$, $SiNx$, $Y_2O_3$ and $Al_2O_3$, or can be a multi-layer in which $SiO_2$ and $SiNx$ are stacked in turn. The organic layer can be Parylene or HDPE, and the organic-inorganic composite layer can be a composite layer of $Al_2O_3$ and an organic polymer.

Then, red, green and blue color filter layers 230a, 230b and 230c are formed on the passivation layer 220 to correspond to the organic layers formed in the red, green and blue pixel regions a, b and c, except for white pixel region. The color filter layers 230a, 230b and 230c are sequentially formed, and one end of the respective other two color filter layers 230a and 230c can overlap each end of the first-formed color filter layer 230b among the color filter layers.

The color filter layers 230a, 230b and 230c can be formed by a laser induced thermal imaging method, which is described in detail below.

Figure 2A:
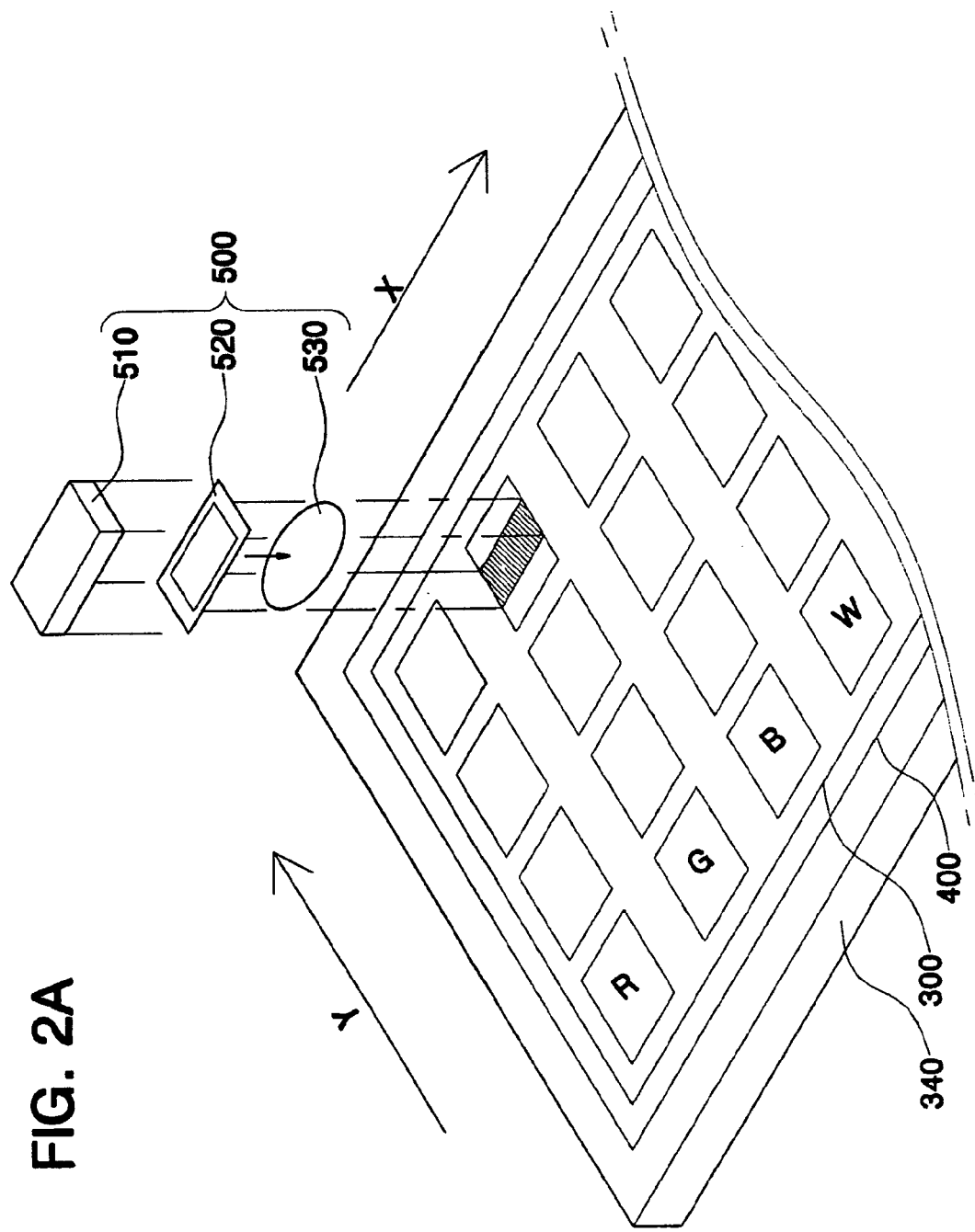

FIGS. 2A and 2B are a perspective view and a cross-section view of a method of fabricating a color filter layer using a laser induced thermal imaging method according to an exemplary embodiment of the invention.

Referring to FIGS. 2A and 2B, the laser induced thermal imaging method requires at least a laser irradiation device, an acceptor substrate and a donor film which includes a base film, a Light-To-Heat Conversion (LTHC) layer and a transfer layer.

In the laser induced thermal imaging method, the transfer layer is disposed opposite to the acceptor substrate, and the donor film is laminated on the entire surface of the acceptor substrate and then a laser beam is irradiated onto the base film. The laser beam irradiated onto the base film is absorbed in the LTHC layer and converted into heat energy. By the heat energy, the transfer layer is transferred onto the acceptor substrate. As a result, a transfer layer pattern is formed on the acceptor substrate.

To perform the laser induced thermal imaging method, first, an acceptor substrate 300 is provided. The acceptor substrate 300 includes red (R), green (G), blue (B) and white (W) pixel regions. The pixel regions can be arranged in a stripe pattern. An organic light emitting diode 320 including at least a first electrode, an organic EML and a second electrode is formed on a base layer 310 of the acceptor substrate 300. The acceptor substrate 300 can further include a passivation layer 330. The acceptor substrate 300 is fixed on a chuck 340, which includes a moving means.

Then, a donor film 400 is provided. The donor film 400 includes a base film 410, and an LTHC layer 420 and a transfer layer 430 which are disposed on the base film 410. The transfer layer 430 is formed by wet-coating the LTHC layer 420 with a color filter layer material including a pigment, etc.

The transfer layer 430 is disposed opposite to the acceptor substrate 300, and the donor film 400 is laminated on the acceptor substrate 300. Then, a laser irradiation device 500 including a laser generator 510, a mask 520 and a projection lens 530 is disposed on the donor film 400 and a laser beam is irradiated.

In the donor film 400 of the region on which the laser beam is irradiated, the LTHC layer 420 absorbs the laser beam and generates heat, and the transfer layer 430 is transferred onto the acceptor substrate 300 due to weak adhesion between the transfer layer 430 and the LTHC layer 420 caused by the heat. As a result, a transfer layer pattern, i.e., a color filter layer, is formed on the passivation layer 330 of the acceptor substrate 300.

As the laser irradiation device 500 moves in a Y direction, first, a green color filter layer is formed. When the laser irradiation device 500 reaches an edge of a green pixel region G of the acceptor substrate 300, the chuck 340 moves one step by the moving means. Then, the transfer layer patterns, i.e., the red, green and blue color filter layers, can be formed on the entire surface of the substrate by repeating the lamination and laser irradiation described above.

Figure 3A:
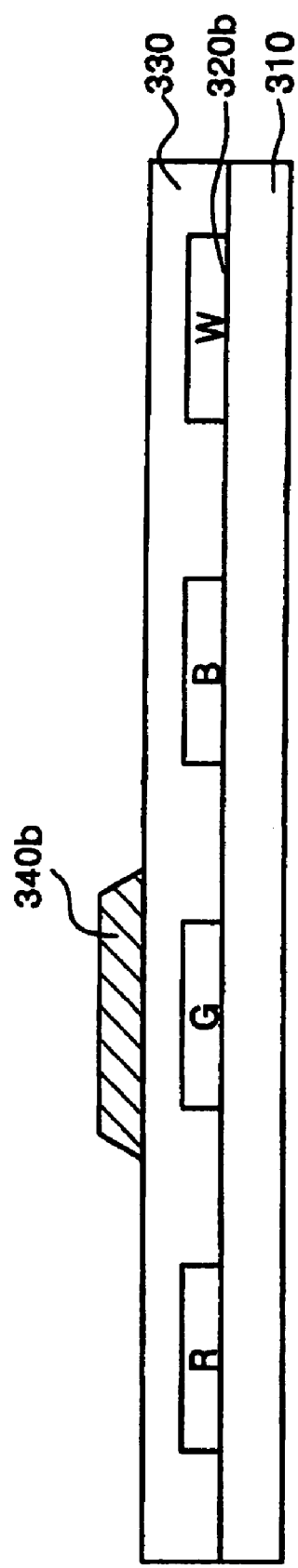
Figure 3C:
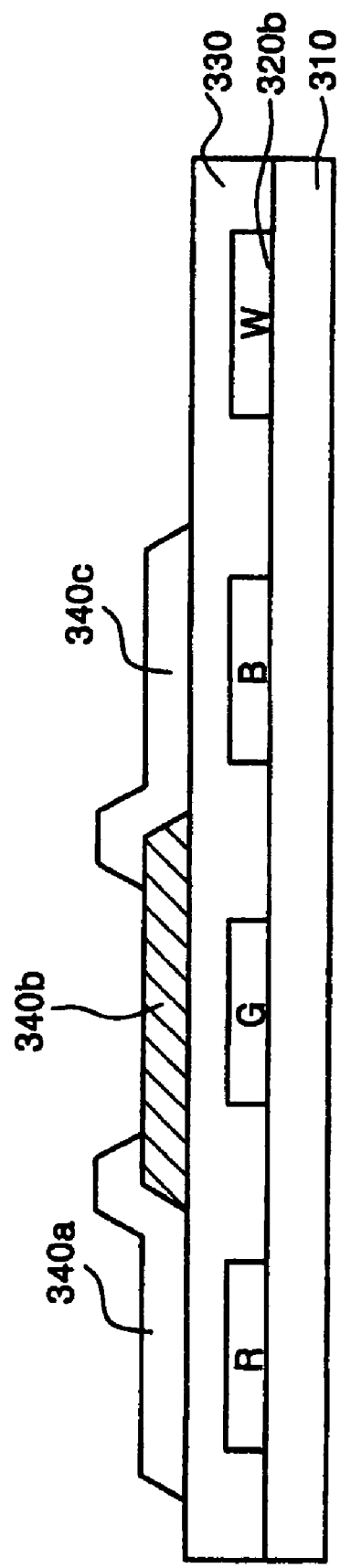

FIGS. 3A to 3C are cross-sectional views illustrating a method of fabricating a color filter layer according to an exemplary embodiment of the invention.

Referring to FIG. 3A, a green color filter layer 340b is formed on the passivation layer 330 arranged on the base layer 310 to correspond to an organic layer 320b in a green pixel region using the laser induced thermal imaging method. The green color filter layer 340b extends to a space between the adjacent pixel regions, i.e., a non-emission region, besides the region corresponding to the organic layer 320b.

Referring to FIG. 3B, a red color filter layer 340a is formed to overlap the green color filter layer 340b at its one end. The red color filter layer 340a overlaps the green color filter layer 340b in a non-emission region between the green pixel region b and the red pixel region a. Thus, contrast of each pixel can be increased without forming a separate black matrix between the pixel regions, thereby implementing a high-resolution OLED.

The region in which the green and red color filter layers 340b and 340a overlap each other can be 50 to 90% of the non-emission region between the pixel regions. When the overlapping region is smaller than 50% of the non-emission region, it is difficult to improve contrast, whereas when the overlapping region is bigger than 90% of the non-emission region, the green or red color filter layer 340b or 340a may extend the emission region of the red or green pixel region due to limitations of a process such as alignment. As a result, color purity of each pixel can be degraded.

Referring to FIG. 3B, a blue color filter layer 340c is formed to overlap the green color filter layer 340b at its opposite end. The blue color filter layer 340c overlaps the green color filter layer 340b in a non-emission region between the green and blue pixel regions. Thus, the contrast of each pixel can be increased without forming a separate black matrix between the pixel regions, resulting in a high-resolution OLED.

When the organic EMLs include red, green, blue and white EMLs, the color filter layers having the respective colors are formed to correspond to the respective EMLs. Thus, in a full-color display, the luminance of an OLED can be increased by driving the red, green and blue EMLs which have improved color purity and contrast, and in a white display, life span of an OLED can be increased by driving a white EML.

Also, when the organic EMLs are white EMLs, the EMLs can keep the white balance constant even during long driving times because there is no difference in the life span between EMLs, and thus, a high-contrast OLED can be provided.

As described above, since the color filter layers 340a and 340c are formed by a laser induced thermal imaging method, a fabrication process can be simplified. Also, one end of each of the color filter layers 340a and 340c is formed to overlap the first-formed color filter layer 340b, thereby implementing a high-contrast and high-resolution OLED without a black matrix.

Consequently, a method of fabricating an OLED according to the present invention can have a simple process, and a high contrast and resolution.

Although the present invention has been described with reference to certain exemplary embodiments thereof, it will be understood by those skilled in the art that a variety of modifications can be made to the described exemplary embodiments without departing from the spirit and scope of the present invention as defined by the appended claims.

What is claimed is:

1. A method of fabricating an Organic Light Emitting Diode (OLED), the method comprising:
    forming red, green, blue and white pixel regions on a substrate;
    forming first electrodes in respective pixel regions on the substrate, the first electrodes being spaced apart from one another;
    forming a pixel defining layer having an opening partially exposing surfaces of the first pixel electrodes on the substrate;
    forming organic layers including at least an organic EMission Layer (EML) in the opening of the pixel defining layer;
    forming a second electrode on the organic layers;
    forming a passivation layer on the second electrode; and
    forming red, green and blue color filter layers on the passivation layer using a laser induced thermal imaging method to correspond to the organic layers of the red, green and blue pixel regions, the red, green and blue color filter layers being formed with the ends of a first-formed color filter layer arranged underneath both a second and a third formed color filter layers, and one end of each of the second and third formed color filter layers overlap and are on top of each end of the first-formed color filter layer.

2. The method according to claim 1, wherein the first-formed color filter layer is formed to extend to a corresponding organic layer and to a non-emission region arranged between adjacent pixel regions.

3. The method according to claim 1, wherein a region in which the color filter layers overlap each other comprises a non-emission region arranged between adjacent pixel regions.

4. The method according to claim 1, wherein the organic light emitting diode is absent of a black matrix.

5. The method according to claim 1, wherein the organic EML comprises red, green, blue and white EMLs.

6. The method according to claim 1, wherein the first-formed color filter layer being the green color filter layer.

7. The method according to claim 1, wherein underneath is closer to the passivation layer and on top of is further from the passivation layer.

8. A method of fabricating an Organic Light Emitting Diode (OLED), the method comprising:
    forming red, green, blue and white pixel regions on a substrate;
    forming first electrodes in respective pixel regions on the substrate, the first electrodes being spaced apart from one another;
    forming a pixel defining layer having an opening partially exposing surfaces of the first pixel electrodes on the substrate;
    forming organic layers including at least an organic EMission Layer (EML) in the opening of the pixel defining layer;
    forming a second electrode on the organic layers;
    forming a passivation layer on the second electrode; and
    forming red, green and blue color filter layers on the passivation layer using a laser induced thermal imaging method to correspond to the organic layers of the red, green and blue pixel regions, the red, green and blue color filter layers being sequentially formed with the ends of a first-formed color filter layer being one of the red, green and blue color filter layers and being arranged underneath and closer to the passivation layer than ends of both a second and a third formed color filter layers, the second and third formed color filter layers being other ones of the red, green and blue color filter layers, one end of each of the second and third formed color filter layers being arranged on top of and further from the passivation layer than each end of the first-formed color filter layer.

9. A method of fabricating an Organic Light Emitting Diode (OLED), the method comprising:
  forming red, green, blue and white pixel regions on a substrate;
  forming first electrodes in respective pixel regions on the substrate, the first electrodes being spaced apart from one another;
  forming a pixel defining layer having an opening partially exposing surfaces of the first pixel electrodes on the substrate;
  forming organic layers including at least an organic EMission Layer (EML) in the opening of the pixel defining layer;
  forming a second electrode on the organic layers;
  forming a passivation layer on the second electrode; and
  forming a first color filter layer on the passivation layer, the first color filter layer being one of a green, red and blue color filter layers;
  forming a second color filter layer on the passivation layer and on a first end of the first color filter layer, the second color filter layer being another of the green, red and blue color filter layers; and
  forming a third color filter layer on the passivation layer and on a second and opposite end of the first color filter layer, the third color filter layer being one of a green, red and blue color filter layers and having a different color from that of each of the first and second color filter layers.

10. The method of claim 9, the OLED being absent of a black matrix.

11. The method of claim 9, wherein a region where the second and third color filter layers overlap the first and second ends respectively of the first color filter layer are arranged in a non-emission region between adjoining ones of the red, green, blue and white pixel regions.

12. The method of claim 9, the first color filter layer being the green color filter layer.

13. The method of claim 9, wherein each of the first, second and third color filter layers are sequentially formed by a laser induced thermal imaging technique.

14. The method of claim 9, wherein a region where the second and third color filter layers overlap the first and second ends respectively of the first color filter layer provide a high-contrast and high resolution OLED without a black matrix.

* * * * *